(12) United States Patent
Sato (10) Patent No.: US 8,563,984 B2
(45) Date of Patent: Oct. 22, 2013

(54) SEMICONDUCTOR DEVICE

(75) Inventor: Ken Sato, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 229 days.

(21) Appl. No.: 12/833,483

(22) Filed: Jul. 9, 2010

(65) Prior Publication Data

US 2011/0006308 A1    Jan. 13, 2011

(30) Foreign Application Priority Data

Jul. 10, 2009    (JP) .................................. 2009-163838

(51) Int. Cl.
*H01L 29/20*    (2006.01)

(52) U.S. Cl.
USPC ...... 257/76; 257/190; 257/183; 257/E29.089; 257/E29091; 438/60; 438/48

(58) Field of Classification Search
USPC ............ 257/76, 190, 183, E29.089, E29.091; 438/60, 48
See application file for complete search history.

(56) References Cited

U.S. PATENT DOCUMENTS

| | | | |
|---|---|---|---|
| 7,408,182 B1 * | 8/2008 | Smart et al. ................ 257/13 |
| 2003/0213975 A1 * | 11/2003 | Hirose et al. ............... 257/194 |
| 2004/0157355 A1 | 8/2004 | Kachi et al. | |
| 2006/0003490 A1 | 1/2006 | Shiozawa et al. | |
| 2006/0108602 A1 | 5/2006 | Tanimoto | |
| 2006/0170003 A1 | 8/2006 | Saito et al. | |
| 2006/0219997 A1 | 10/2006 | Kawasaki et al. | |
| 2006/0278892 A1 * | 12/2006 | Harris et al. ................ 257/194 |
| 2007/0048954 A1 | 3/2007 | Kato et al. | |
| 2007/0117355 A1 | 5/2007 | Ueda et al. | |
| 2007/0235768 A1 | 10/2007 | Nakazawa et al. | |
| 2007/0254431 A1 | 11/2007 | Saito et al. | |
| 2008/0116486 A1 | 5/2008 | Saito et al. | |
| 2008/0265258 A1 | 10/2008 | Tanabe et al. | |
| 2009/0127564 A1 | 5/2009 | Irikura et al. | |
| 2009/0189186 A1 | 7/2009 | Tanabe et al. | |
| 2009/0189190 A1 | 7/2009 | Hashimoto et al. | |
| 2010/0117094 A1 | 5/2010 | Nishikawa et al. | |

FOREIGN PATENT DOCUMENTS

| | | | |
|---|---|---|---|
| JP | 2001-326232 A | 11/2001 |
| JP | 2002-222817 A | 8/2002 |
| JP | 2004-260140 A | 9/2004 |
| JP | 2005-311326 A | 11/2005 |
| JP | 2005-347534 A | 12/2005 |
| JP | 2006-41458 A | 2/2006 |
| JP | 2006-134935 A | 5/2006 |

(Continued)

*Primary Examiner* — Thinh T Nguyen
(74) *Attorney, Agent, or Firm* — Birch, Stewart, Kolasch & Birch, LLP (57) ABSTRACT

Device having reduced buffer leak on GaN substrate. In HEMT device, n-GaN (n-type GaN wafer) is used as substrate 11. Non-doped $Al_pGa_{1-p}N$ layer with non-uniform composition p is formed on substrate 11 as buffer layer 12. On buffer layer 12, channel layer 13 of semi-insulating GaN and electron supply layer 14 of n-AlGaN are sequentially formed. In buffer layer 12, substrate connection region 121 where p=0 (GaN) is formed on lower end side, and active layer connection region 122 where value of p is also 0 (GaN) is formed on upper end side (channel layer 13 side). High Al composition region 123 where value of p is set to 1 (p=1) (AlN) is formed between substrate connection region 121 and active layer connection region 122. Resistivity of the high Al composition region 123 is highest in the buffer layer.

9 Claims, 6 Drawing Sheets

(56) References Cited

FOREIGN PATENT DOCUMENTS

| | | |
|---|---|---|
| JP | 2006-173582 A | 6/2006 |
| JP | 2006-216671 A | 8/2006 |
| JP | 2006-269586 A | 10/2006 |
| JP | 2006-286910 A | 10/2006 |
| JP | 2006-295126 A | 10/2006 |
| JP | 2006-303439 A | 11/2006 |
| JP | 2006-303475 A | 11/2006 |
| JP | 2006-332367 A | 12/2006 |
| JP | 2006-351794 A | 12/2006 |
| JP | 2007-59696 A | 3/2007 |
| JP | 2007-103451 A | 4/2007 |
| JP | 2007-134608 A | 5/2007 |
| JP | 2007-142243 A | 6/2007 |
| JP | 2007-150292 A | 6/2007 |
| JP | 2007-266203 A | 10/2007 |
| JP | 2007-294769 A | 11/2007 |
| JP | 2007-305609 A | 11/2007 |
| JP | 2008-130655 A | 6/2008 |
| JP | 2008-227478 A | 9/2008 |
| JP | 2009-126727 A | 6/2009 |
| WO | WO 2006/065324 A2 | 6/2006 |
| WO | WO 2006/110204 A2 | 10/2006 |

* cited by examiner

SEMICONDUCTOR DEVICE

BACKGROUND OF THE INVENTION

1. Field of the Invention

The present invention relates to a structure of a semiconductor device having an active area on the heterojunction of a nitride semiconductor.

2. Description of the Related Art

Figure 10:
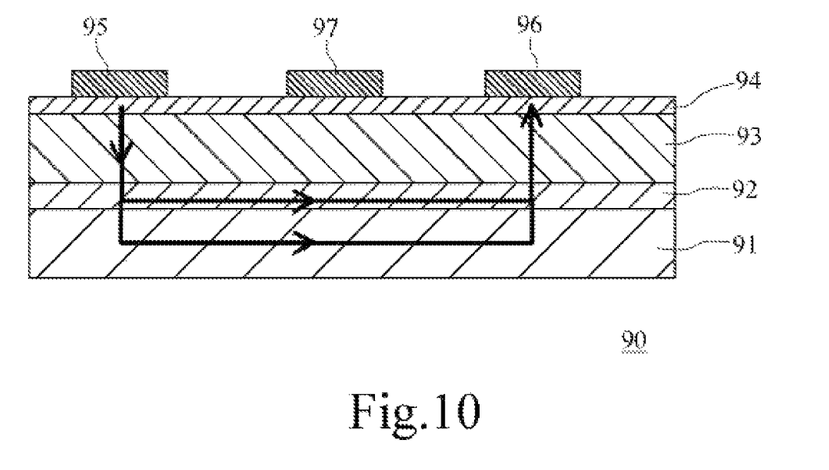
FIG. 10 is a cross-sectional view of a conventional HEMT device using a nitride semiconductor.

As a semiconductor device using a compound semiconductor, particularly, a high output and high frequency device, an HEMT (High Electron Mobility Transistor) using GaN can be taken as an example. A schematic cross-sectional structure of an HEMT device 90 is illustrated in FIG. 10. In FIG. 10, a channel layer 93 and an electron supply layer 94 are formed by epitaxial growth on a substrate 91 with a buffer layer 92 interposed therebetween. The channel layer 93 is formed of semi-insulating (non-doped) GaN, and electron supply layer 94 is formed of n-AlGaN (to be exact, n-type $Al_xGa_{1-x}N$, x is about 0.20). A two-dimensional electron gas layer is formed on the channel layer 93 side of the interface between the channel layer 93 and electron supply layer 94. The two-dimensional electron gas layer is formed between a source electrode 95 and drain electrode 96 to allow current to flow between the source and drain electrodes 95 and 96. ON/OFF of the two-dimensional electron gas channel is controlled by voltage applied to a gate electrode 97, whereby switching operation is performed. At this time, the speed (mobility) of the electron in the two-dimensional electron gas becomes extremely high, thereby allowing high-speed operation. Further, since the GaN has a larger band gap than that of GaAs, etc., the HEMT device 90 exhibits a high dielectric breakdown voltage and can perform high power operation. In order to obtain favorable amplification characteristics or switching characteristics in this configuration, it is necessary to increase on/off ratio of current flowing between the source and drain electrodes 95 and 96 or on/off ratio of a resistance therebetween. Note that FIG. 10 illustrates the simplest structure of the HEMT device, and the actual structure thereof often differs from that of FIG. 10, wherein, for example, the shape of a contact between source electrode 95 and electron supply layer 94, shape of a contact between the drain electrode 96 and electron supply layer 94, and shape around the gate electrode 97 are actually more optimized than illustrated.

The channel layer 93 and electron supply layer 94 are formed by epitaxial growth on the substrate 91, and the characteristics of the HEMT device 90 are significantly influenced by the crystallinities of the channel layer 93 and electron supply layer 94. The crystallinities of the channel layer 93 and electron supply layer 94, and cost of the HEMT depend strongly on the substrate 91, so that the selection of the material of the substrate 91 is an important factor. For example, the substrate 91 may be a sapphire substrate, a semi-insulating SiC substrate, or the like. However, since it is difficult to directly form the channel layer 93 (semi-insulating GaN) having favorable crystallinity on such a material (wafer), the buffer layer 92 made of a material other than above needs to be formed between the channel layer 93 and substrate 91. Further, since the sapphire substrate and semi-insulating SiC substrate are expensive, the use of another wafer has been studied.

Recently, as a GaN wafer, an n-GaN (n-type GaN) wafer of a manageable size can be obtained at low cost for use as the substrate 91. For example, there is disclosed as a fourth embodiment of Patent Document 1, an HEMT device having a structure using a GaN wafer as the substrate 91. In this case, the semi-insulating GaN having favorable characteristics can comparatively easily be formed on the substrate 91 as the channel layer 93 due to the use of the same material.

Further, from the viewpoint of reducing the on-resistance of the HEMT device 90, there is disclosed in, e.g., FIGS. 13 and 14 of Patent Document 2, a technique that uses a penetrating electrode that penetrates the HEMT device from the source electrode 95 to the substrate 91 so as to forcibly make the potentials of the source electrode 95 and substrate 91 equal to each other. According to this technique, a rear surface electrode formed widely on the rear surface of the substrate 91 can be used as the source electrode. Thus, as described in paragraph [0046] of Patent Document 2, a source electrode pad need not be formed on the front (upper) surface side of the HEMT device 90, thereby allowing efficient use of the entire chip.

CITATION LIST

Patent Document

[Patent Document 1] Jpn. Pat. Publication No. 2009-126727
[Patent Document 2] Jpn. Pat. Publication No. 2006-216671

However, the above technique has a problem with breakdown voltage characteristics when high voltage is applied between the source electrode 95 and drain electrode 96 or leak current between them. More specifically, the insulating resistance at OFF-time between the source and drain electrodes 95 and 96 is lowered, or leak current flows also during pinch-off operation at ON-time, which may affect the operation of the chip.

SUMMARY OF THE INVENTION

As described above, the two-dimensional electron gas (channel) constituting a main part of current flowing at ON-time passes immediately under the gate electrode 97, and ON/OFF of the two-dimensional electron gas is controlled by voltage applied to the gate electrode 97. However, current flows between the source electrode 95 and drain electrode 96 through a route other than the above. The current (flow of electrons) flowing such a route may constitute a main part of the leak current. An example of such a route includes, e.g., a route passing through the buffer layer 92 and a route passing through the substrate 91, as denoted by arrows in FIG. 10. The influence of the leak current is significant when the above-mentioned n-GaN wafer is used as the substrate 91 because the substrate 91 itself is electrically conductive.

To improve the above situation, there can be considered a structure in which an AlN layer which is known as a material having a band gap wider than that of the GaN and a satisfactory insulating property or a semi-insulating non-doped AlGaN layer which is a mixed crystal of the AlN and GaN is formed on the n-GaN wafer (substrate 91) as the buffer layer 92, and the channel layer 93 is formed on the thus-formed buffer layer 92. In this case, however, a large lattice mismatch occurs between the AlN or AlGaN constituting the buffer layer 92 and GaN constituting the channel layer, so that many crystal defects such as dislocation are formed at the interface between the AlN or AlGaN and GaN to bring about electrical conduction through the crystal defect layer. This causes the leak current (buffer leak) to flow between the source and drain electrodes 95 and 96. This occurs also when the sapphire or SiC is used as the substrate.

Further, the above problem occurs not only in the HEMT device but also in a device that has a hetero-structure on a GaN substrate and operates with current flowing in the lateral direction (direction parallel to the substrate surface), such as MESFET (Metal-Semiconductor Field Effect Transistor) or SBD (Schottky Barrier Diode).

To solve the above problems, the present invention is configured as follows.

There is provided a semiconductor device having a configuration in which an active layer having a composition represented by a chemical formula: $Al_xM_yGa_{1-x-y}N$ ($0 \leq x<1$, $0 \leq y<1$, $0 \leq x+y<1$, where M contains at least one of In and B) is formed on a conductive gallium nitride (GaN) substrate via a buffer layer and operates with current flowing through the active layer in the direction parallel to the surface of the substrate, wherein the buffer layer has a composition represented by a chemical formula: $Al_pM_qGa_{1-p-q}N$ ($0 \leq p<1$, $0 \leq q<1$, $0 \leq p+q<1$) and includes: a substrate connection region where $p=q=0$ which is formed on the side contacting the substrate in the thickness direction thereof; an active layer connection region where $p=x$ and $q=y$ which is formed on the side contacting the active layer in the thickness direction; and a high Al composition region where $p>x$ which is formed between the substrate connection region and active layer connection region in the thickness direction.

In the semiconductor device according to the present invention, the buffer layer includes: a substrate side gradient composition region which is formed between the high Al composition region and substrate connection region in the thickness direction and has a gradient composition that varies such that the composition of the substrate side gradient composition region becomes the same as that of the high Al composition region on the high Al composition region side and composition of the substrate side gradient composition region becomes the same as that of the substrate connection region on the substrate connection region side; and a active layer side gradient composition region which is formed between the high Al composition region and active layer connection region in the thickness direction and has a gradient composition that varies such that the composition of the active layer side gradient composition region becomes the same as that of the high Al composition region on the high Al composition region side and composition of the active layer side gradient composition region becomes the same as that of the active layer connection region on the active layer connection region side.

In the semiconductor device according to the present invention, the buffer layer includes a configuration in which a plurality of the high Al composition regions are arranged with a plurality of low Al composition regions in each of which $p<p_1$ in the case where the value of p in the high Al composition region is set to $p_1$ ($p=p_1$) interposed between two adjacent high Al composition regions in the thickness direction.

In the semiconductor device according to the present invention, three or more layers of the high Al composition region are formed, and the high Al composition region formed in the thickness direction center portion of the buffer layer has a larger thickness than those of the high Al composition regions formed in the thickness direction both ends of the buffer layer.

In the semiconductor device according to the present invention, four or more layers of the high Al composition region are formed, and the low Al composition region formed in the thickness direction center portion of the buffer layer has a smaller thickness than those of the low Al composition regions formed in the thickness direction both ends of the buffer layer.

In the semiconductor device according to the present invention, three or more layers of the high Al composition region are formed, and the high Al composition region formed in the thickness direction center portion of the buffer layer has a larger p value than those of the high Al composition regions formed in the thickness direction both ends of the buffer layer.

In the semiconductor device according to the present invention, four or more layers of the high Al composition region are formed, and the low Al composition region formed in the thickness direction center portion of the buffer layer has a larger p value than those of the low Al composition regions formed in the thickness direction both ends of the buffer layer.

In the semiconductor device according to the present invention, one of electrodes connected to the active layer is connected to the substrate via a penetrating electrode penetrating the buffer layer.

In the semiconductor device according to the present invention, a rear surface electrode is formed on the surface of the substrate opposite to the surface on which the buffer layer is formed, and the penetrating electrode penetrates the substrate to be connected to the rear surface electrode.

With the above configuration, a semiconductor device in which a buffer leak on the GaN substrate is reduced can be obtained.

DETAILED DESCRIPTION OF THE PREFERRED EMBODIMENTS

An HEMT (High Electron Mobility Transistor) device will be described below as a semiconductor device according to the embodiment of the present invention. The HEMT device has a hetero-structure on a GaN substrate and operates with current flowing in the lateral direction, i.e., direction parallel to the substrate surface. The HEMT device is designed such that a leak current (buffer leak) flowing in the vertical direction at this operation time is suppressed.

First Embodiment

Figure 1:
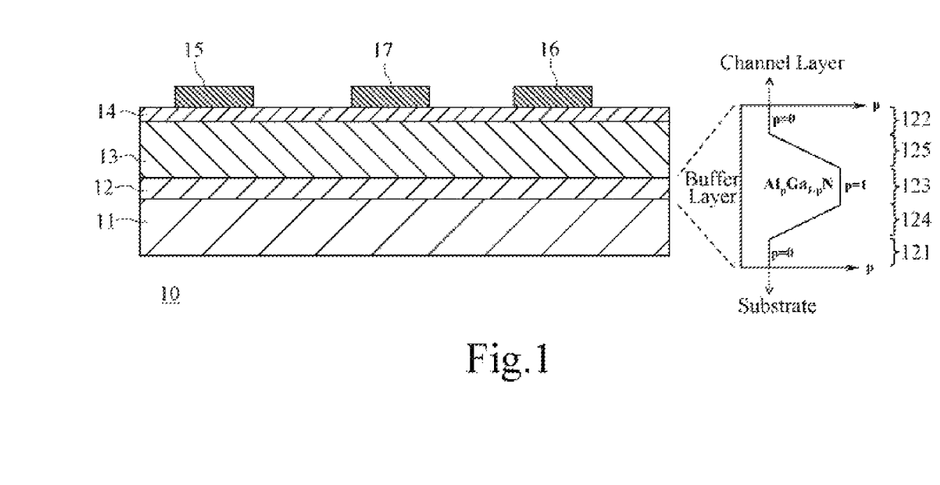
FIG. 1 is a cross-sectional view of an HEMT device according to a first embodiment of the present invention and a composition distribution in a buffer layer included in the HEMT device.

FIG. 1 illustrates a cross-sectional structure (left side) of the HEMT device according to a first embodiment and a composition distribution (right side) in a buffer layer included in the HEMT device. In this HEMT device 10, n-GaN (n-type GaN wafer) is used as a substrate 11. A non-doped $Al_pGa_{1-p}N$ layer with non-uniform composition p is formed on the substrate 11 as a buffer layer 12. On the buffer layer 12, an channel layer 13 formed of semi-insulating GaN and an electron supply layer 14 formed of n-AlGaN are sequentially formed by an MBE (Molecular Beam Epitaxy) method, an MOVPE (Metalorganic Vapor Phase Epitaxy) method, or the like. The channel layer 13 and electron supply layer 14 each function as an active layer in the HEMT device 10. The n-AlGaN constituting the electron supply layer 14 is n-type $Al_xGa_{1-x}N$, (x is about 0.20). A source electrode 15 and a drain electrode 16 are formed on the electron supply layer 14, and a two-dimensional electron gas is formed on the channel layer 13 side of the interface between the channel layer 13 and electron supply layer 14. ON/OFF of the two-dimensional electron gas channel is controlled by voltage which is applied to a gate electrode 17 via a depletion layer. The source electrode 15 and drain electrode 16 are each formed of a material that ohmicaly contacts the electron supply layer 14 (n-Al-GaN), such as Ti/Au. The gate electrode 17 is made of a material that Schottky-contacts the n-AlGaN and forms a depletion layer in the n-AlGaN, such as Ni/Au.

The HEMT device 10 is featured in that the buffer layer 12 is formed of non-doped $Al_pGa_{1-p}N$ with non-uniform composition p. In the graph illustrated on the right side of FIG. 1, the thickness direction position in the buffer layer 12 is represented by the vertical axis with the substrate 11 side set as the lower side and channel layer 13 side as the upper side, and the value of the composition p in that position is represented by the horizontal axis. In this composition, a region (substrate connection region 121) where the value of p is set to 0 (p=0) (GaN) is formed on the lower end side (substrate 11 side), and a region (active layer connection region 122) where the value of p is also set to 0 (p=0) (GaN) is formed on the upper end side (channel layer 13 side). A region (high Al composition region 123) where the value of p is set to 1 (p=1) (AlN) is formed between the substrate connection region 121 and active layer connection region 122. The resistivity of the high Al composition region 123 is the highest in the buffer layer 12.

A region (substrate side gradient composition region 124) where the value of the composition p gradually varies is formed between the high Al composition region 123 and substrate connection region 121. In the substrate side gradient composition region 124, the value of the composition p varies such that p is set to 1 (p=1) (the same composition as the high Al composition region 123) on the high Al composition region 123 side and p is set to 0 (p=0) (the same composition as the substrate connection region 121) on the substrate connection region 121 side. Similarly, a region (active layer side gradient composition region 125) where the value of the composition p gradually varies is formed between the high Al composition region 123 and active layer connection region 122. In the active layer side gradient composition region 125, the value of the composition p varies such that p is set to 1 (p=1) (the same composition as the high Al composition region 123) on the high Al composition region 123 side and p is set to 0 (p=0) (the same composition as the active layer connection region 122) on the active layer connection region 122 side.

The entire buffer layer 12 is formed of $Al_pGa_{1-p}N$ and has a semi-insulating property. Particularly, a layer (high Al composition region 123) where the value of p is set to 1 is formed of AlN having a wider band gap of 6.3 eV relative to 3.4 eV of the GaN and thus has a high insulating property. Therefore, electrical conduction via the buffer layer 12 is suppressed and, accordingly, the electrical conduction from the channel layer 13 to substrate 11 (n-GaN) is suppressed. Alternatively, the average resistivity of the buffer layer 12 is sufficiently higher than those of the substrate 11 and channel layer 13.

The substrate connection region 121 near the lower end that contacts the substrate 11 (n-GaN) and active layer connection region 122 near the upper end that contacts the channel layer 13 (semi-insulating GaN layer) are each formed of the same material (GaN) as those of the substrate 11 and channel layer 13. Thus, a crystal defect such as dislocation due to a lattice mismatch does not occur so frequently at the interfaces therebetween. Further, the channel layer 13 (semi-insulating GaN layer) having favorable characteristics can be made to grow on the buffer layer 12.

In the buffer layer 12, the substrate side gradient composition region 124 and active layer side gradient composition region 125 are formed. In this example, the lattice constants of the substrate connection region 121 and high Al composition region 123 differ from each other and the lattice constants of the active layer connection region 122 and high Al composition region 123 also differ from each other. However, the substrate side gradient composition region 124 and active layer side gradient composition region 125 relax the lattice mismatch, thereby reducing occurrence of the crystal defect such as dislocation due to the lattice mismatch. Therefore, electrical conduction in the buffer layer 12 via the crystal defect is suppressed.

As a result, a buffer leak via the buffer layer 12 is reduced, whereby the HEMT device 10 having favorable characteristics can be obtained.

In a process of forming the buffer layer 12 on the substrate (n-GaN) 11 using the MOVPE method, the flow rate of a raw material gas (e.g., TMA: Trimethylaluminum) of Al is made to vary in accordance with the composition distribution illustrated in FIG. 1. In the MBE method, the Al molecular beam intensity is made to vary in the same manner. Although the value of p varies in a continuous fashion in the substrate side gradient composition region 124 and active layer side gradient composition region 125 in FIG. 1, this variation may be made in a stepwise manner. That is, this composition variation may arbitrarily be set depending on the formation method of the buffer layer 12. Further, in the example of FIG. 1, the substrate side gradient composition region 124 and active layer side gradient composition region 125 have the same thickness, and the composition distribution curve has a symmetric shape. However, the thicknesses thereof need not be made equal to each other, and the composition distribution curve need not be made symmetrical and, as long as the abovementioned effect is attained, the substrate side gradient composition region 124 and active layer side gradient composition region 125 may have any thickness, and the composition distribution curve may have any shape.

Figure 2:
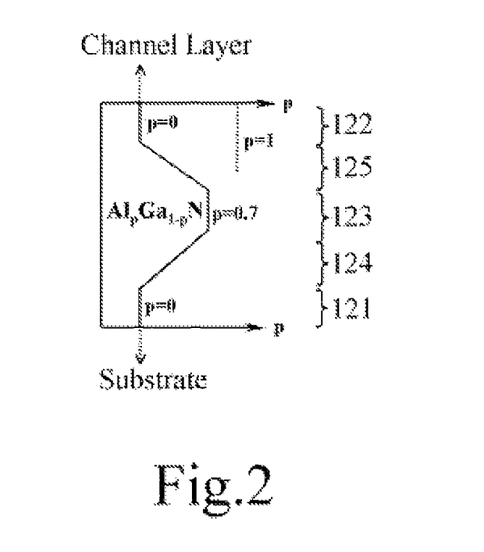
FIG. 2 illustrates another example of a composition distribution in the buffer layer included in the HEMT device according to the first embodiment.

Further, as long as the abovementioned effect is attained, the value of p in the high Al composition region 123 (region having the highest insulating resistance) may be set not to 1 but arbitrarily in a range of 0<p<1. As an example, composition distribution illustrated in FIG. 2 may be used in place of the composition distribution of FIG. 1. In this example, the value of p in the high Al composition region 123 is not set to 1 but set to 0.70. In this case, the insulating property of the high Al composition region 123 itself is inferior to that in the case of FIG. 1. However, the lattice constant of the high Al composition region 123 becomes close to those of substrate connection region 121 and active layer connection region 122, so that it is possible to further reduce occurrence of the crystal defect in the substrate side gradient composition region 124 and active layer side gradient composition region 125.

Figure 3:
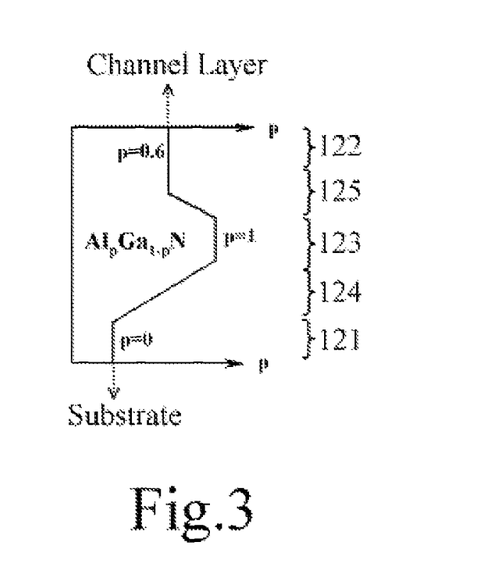
FIG. 3 illustrates still another example of a composition distribution in the buffer layer included in the HEMT device according to the first embodiment.

Further, although the channel layer 13 is the semi-insulating GaN layer in the above example, the channel layer 13 may be a semi-insulating (non-doped) $Al_xGa_{1-x}N$ (0<x<1). In this case, as illustrated in FIG. 3, the composition of the active layer connection region 122 is made conform to the composition of the channel layer. In this example, the channel layer is a semi-insulating $Al_{0.6}Ga_{0.4}N$ layer.

Although the buffer layer 12 is the non-doped $Al_pGa_{1-p}N$ layer in the above example, any material is used to form as the buffer layer 12 as long as the average resistivity of the buffer layer 12 is made higher than those of the channel layer 13 and substrate 11. Further, in order to control the resistivity, stress, or lattice constant, impurity such as C, Mg, or Fe may be doped in the buffer layer 12 as needed.

In the above example, the substrate 11 is formed of n-GaN, the channel layer 13 is formed of GaN or $Al_xGa_{1-x}N$ (0≤x<1), and buffer layer 12 is formed of $Al_pGa_{1-p}N$ (0≤p≤1). However, it is clear that another material system which is GaN-based mixed crystal can be used as the channel layer 13. For example, the channel layer 13 may be formed of $Al_xM_yGa_{1-x-y}N$ (0≤x≤1, 0≤y≤1, 0≤x+y<1, where M contains at least one of In (Indium) and B (boron)) as a nitride semiconductor mixed crystal containing (In) and (B) which each belong to the same element group (IIIB) as Ga and Al. In this case, the buffer layer 12 is formed of non-doped $Al_pM_qGa_{1-p-q}N$ wherein p=0 and q=0 (GaN) in the substrate connection region 121 and p=x and q=y (as in the channel layer 13), whereby the lattice mismatch at the interface between the substrate 11 and buffer layer 12 and lattice mismatch at the interface between the buffer layer 12 and channel layer 13 can be reduced. Further, by setting the value of p larger than x in the high Al composition region 123, the resistivity of the buffer layer 12 can be made higher than those of the substrate 11 and channel layer 13. The composition of the substrate side gradient composition region 124 can be set in the same manner in accordance with the substrate 11 and high Al composition region 123, and composition of the active layer side gradient composition region 125 can be set in the same manner in accordance with the channel layer 13 and high Al composition region 123.

Although the description has been made taking the HEMT device as an example, it is apparent that the present invention can be applied to electronic devices other than the HEMT device. That is, according to the present invention, in a device in which the buffer layer is formed between the GaN substrate and device active layer and current flows in the lateral direction, i.e., in the direction parallel to the substrate surface of the GaN substrate, a leak (buffer leak) through the buffer layer is reduced to thereby increase the breakdown voltage characteristics of the device.

Second Embodiment

In the HEMT device of the above first embodiment, the buffer layer 12 formed of $Al_pGa_{1-p}N$ and including two connection regions (substrate connection region, active layer connection region), high Al composition region, and two gradient composition regions (substrate side gradient composition region, active layer side gradient composition region) is used. The HEMT device according to a second embodiment has the same structure as that illustrated in the left part of FIG. 1. However, the buffer layer used in the second embodiment can attain the same effect as that of the first embodiment without use of the gradient composition region.

Figure 4:
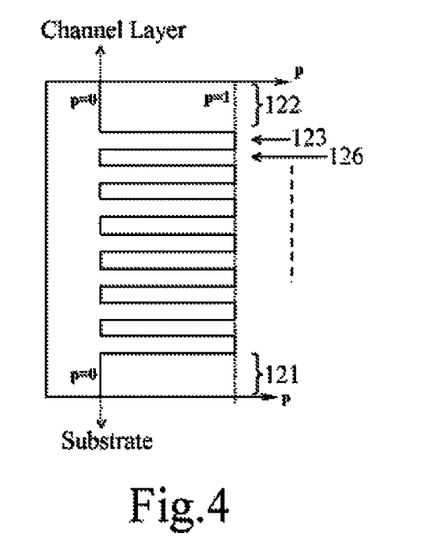
FIG. 4 illustrates an example of a composition distribution in the buffer layer included in the HEMT device according to a second embodiment.

FIG. 4 illustrates an example of composition distribution (p in $Al_pGa_{1-p}N$) of the buffer layer used in the HEMT device according to the second embodiment. The HEMT device of the second embodiment differs from the HEMT device 10 illustrated in FIG. 1 only in the composition distribution of the buffer layer.

The buffer layer of the HEMT device of the second embodiment has a structure in which the gradient composition region is not formed, layers (GaN layer: low Al composition region 126) wherein p=0 and layers (AlN layer: high Al composition region 123) wherein p=1 are alternately formed, and the substrate connection region 121 and active layer connection region 122 are formed in its lower and upper ends as in the first embodiment to provide matching with the substrate 11 (n-GaN) and channel layer 13 (semi-insulating GaN layer). In this example, seven high Al composition regions 123 with same-thickness are formed at even intervals.

In this structure, the formation of the substrate connection region 121 and active layer connection region 122 in the lower and upper ends allows a reduction of the influence of the lattice mismatches at the interfaces between the channel layer 13 and buffer layer and between the buffer layer and substrate 11. This prevents the crystal defect due to the lattice mismatch from occurring so frequently at the interfaces. Thus, as in the first embodiment, the channel layer 13 (semi-insulating GaN layer) having favorable characteristics can be made to grow on the buffer layer.

The high Al composition region 123 in the buffer layer has a high insulating property as described above. Therefore, this buffer layer exhibits a high insulating property in the vertical direction in FIG. 4.

Since the gradient composition region does not exist in this structure, a large lattice mismatch exists at the interface between the high Al composition region 123 and substrate connection region 121, between the high Al composition region 123 and active layer connection region 122, or between the high Al composition region 123 and low Al composition region 126. However, by reducing the thicknesses of the high Al composition region 123 alone or low Al composition region 126 alone so as to provide distortion in the high Al composition region 123 or low Al composition region 126, the lattice mismatch is made to easily be absorbed. Thus, it is possible to prevent the crystal defect due to the lattice mismatch from easily occurring to thereby suppress electrical conduction via the crystal defect in this buffer layer.

In this structure, the composition of the $Al_pGa_{1-p}N$ layer constituting the buffer layer includes only two types of p=0 and p=1. Thus, in a process of forming this buffer layer using, e.g., the MOVPE method, a gas composition corresponding to p=0 and gas composition corresponding to p=1 are appropriately switched for layer growth, whereby the buffer layer having the composition distribution of FIG. 4 can be formed on the substrate 11. As a result, it is possible to form the buffer layer with better controllability than in the case of the first embodiment having the gradient composition region.

Figure 5:
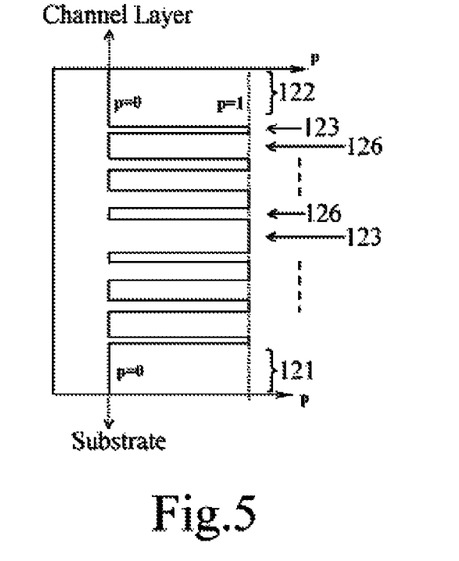
FIG. 5 illustrates another example of a composition distribution in the buffer layer included in the HEMT device according to the second embodiment.

FIG. 5 illustrates a first modification of the composition distribution in the buffer layer. In the example of FIG. 5, the same number of high-resistance layers as in the example of FIG. 4 are arranged but the thickness of the high Al composition region 123 is made smaller in the upper and lower ends and larger in the center portion. This configuration substantially increases contribution of the high Al composition region 123 (AlN) in the center portion and reduces contribution of the high Al composition region 123 (AlN) in the end portions. Thus, as compared to the structure of FIG. 4, the influence of the lattice mismatches at the interfaces between the channel layer 13 and buffer layer and between the buffer layer and substrate 11 can further be reduced. The formation of the buffer layer of the first modification can be carried out in the same manner as in the buffer layer having the composition illustrated in FIG. 4. In the case where the high Al composition region 123 has a small thickness, the insulating property thereof may be insufficient due to presence of tunnel current. In this case, however, the high Al composition region 123 (AlN layer) having a large thickness can be used, which further increase the vertical insulating property in the buffer layer. This structure is effective in the case where three or more layers of the high Al composition region 123 are formed.

Figure 6:
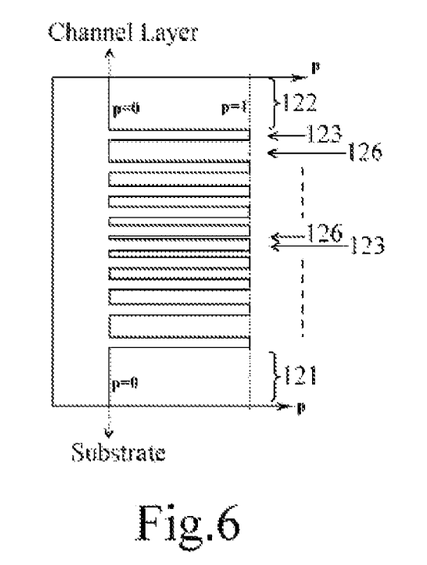
FIG. 6 illustrates still another example of a composition distribution in the buffer layer included in the HEMT device according to the second embodiment.

FIG. 6 illustrates a second modification of the composition distribution in the buffer layer. In the example of FIG. 6, a plurality of layers of the high Al composition region 123 having the same thickness are arranged wherein the density of the high Al composition region 123 in the thickness direction is lower in the upper and lower ends and higher in the center portion. Alternatively, the thickness of the low Al composition region 126 is larger in the upper and lower ends and smaller in the center portion. Thus, as in the case of the structure of FIG. 5, contribution of the high Al composition region 123 (AlN) is increased in the center portion and contribution of the high Al composition region 123 (AlN) is reduced in the end portions, which brings about the same effect as that in the structure of FIG. 5. The formation of the buffer layer of the second modification can be carried out in the same manner as in the buffer layer having the composition illustrated in FIG. 4. This structure is effective in the case where three or more layers (four or more layers of the high Al composition region 123 corresponding to the low Al composition region 126) of the low Al composition region 126 are formed.

In the buffer layer used in the second embodiment, the high Al composition region 123 and low Al composition region 126 each having a small thickness are each formed in a plural number, allowing the lattice mismatch to easily be absorbed by the distortion. The distortion provided depends on which arrangement structure of the high Al composition region 123 and low Al composition region 126 is selected among the examples of FIGS. 4 to 6, as well as, the formation conditions (substrate temperature or gas composition) of the regions 123 and 126, characteristics of the substrate 11, thickness and formation condition of the channel layer 13, etc. Thus, the thicknesses and numbers of layers of the high Al composition region 123 and low Al composition region 126, or which arrangement structure is selected among the examples of FIGS. 4 to 6 can be set arbitrarily in accordance with the characteristics of the substrate 11, formation conditions of the high-resistance region and low-resistance region, formation condition of the channel layer 13, etc., whereby the amount of distortion provided in the buffer layer can be controlled.

Although the value of p is set to 0 (p=0) (GaN) in the low Al composition region 126, and the value of p is set to 1 (p=1) (AlN) in the high Al composition region 123, it is apparent that the same effect can be attained even with the other settings as in the case of first embodiment. For example, as in the case of the second embodiment, the value of p ($=p_1$) in the high Al composition region 123 may be set larger than 0 and smaller than 1 ($0<p=p_1<1$). In this case, the value of p in the low Al composition region 126 is set larger than $p_1$ ($p<p_1$).

In the case where the channel layer is formed not of semi-insulating GaN but of semi-insulating AlGaN, the composition of the active layer connection region is made conform to the semi-insulating AlGaN composition, as in the case of the first embodiment. Further, the channel layer may be formed of a more common material such as $Al_xM_yGa_{1-x-y}N$ as in the first embodiment.

Third Embodiment

Figure 7:
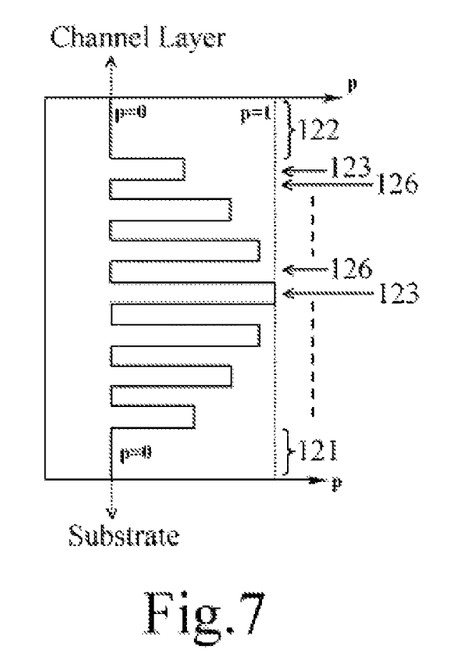
FIG. 7 illustrates an example of a composition distribution in the buffer layer included in the HEMT device according to a third embodiment.

The buffer layer used in a third embodiment has both features of the first and second embodiments, wherein the plurality of the high Al composition region 123 and low Al composition region 126 are alternately arranged but the compositions thereof differ from each other depending on the thickness direction position thereof. FIG. 7 illustrates a composition distribution representing this. In this example, the low Al composition regions 126 and high Al composition regions 123 having the same thickness are alternately formed at even intervals. The value of p in the low Al composition region 126 is set to 0 (p=0) regardless of the depth of the low Al composition region 126. On the other hand, the value of p in the high Al composition region 123 varies depending on the depth of the high Al composition region 123 and is set smaller in the upper and lower ends and larger in the center portion. This composition distribution is similar to that of FIG. 1. The structure of FIG. 7 is effective in the case where three or more layers of the high Al composition region 123 are formed.

Thus, also in this case, contribution of the high Al composition region 123 (AlN) is increased in the center portion and reduced in the end portions, which brings about the same effect as that in the structures of FIGS. 1 and 5. Further, the distortion amount in the buffer layer can be controlled as in the case of the second embodiment. In the case of the third embodiment, the value of p in the high Al composition region 123 can further be used for the distortion amount control, thereby widening the control range of the distortion amount as compared to the second embodiment.

Figure 8:
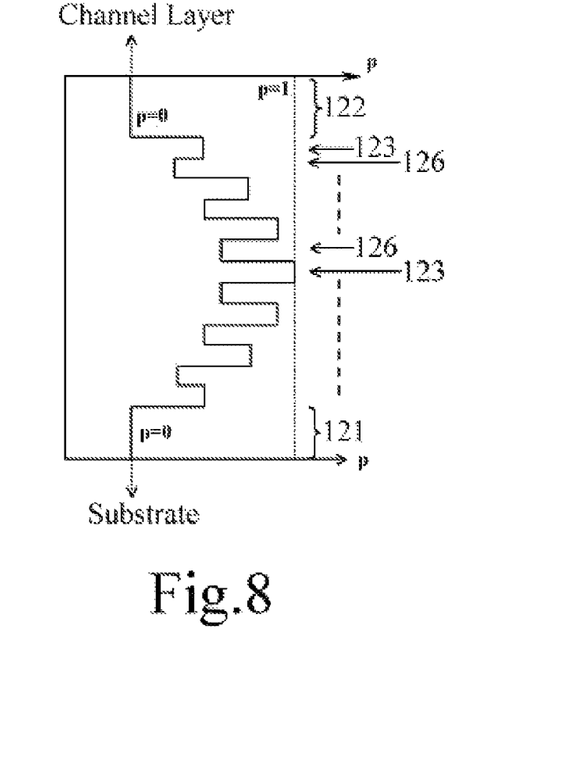
FIG. 8 illustrates another example of a composition distribution in the buffer layer included in the HEMT device according to the third embodiment.

FIG. 8 illustrates a composition distribution in a modification of the buffer layer having the structure of FIG. 7. In this example, the values (value distribution) of p in the high Al composition region 123 are the same as those in FIG. 7. However, in the adjacent low Al composition region 126 and high Al composition region 123, the value of p in the low Al composition region 126 is controlled such that the difference between the value of p in a given high Al composition region 123 and value of p in a low Al composition region 126 that is positioned immediately above the given high Al composition region 123 is made constant. Also in this structure, it is apparent that the same effect as that in the buffer layer having the composition distribution of FIG. 7 can be attained. In this structure, there may be a case where the value of p in a given high Al composition region 123 is smaller than the value of p in a low Al composition region 126 that is not adjacently positioned to the given high Al composition region 123. Thus, the high Al composition region 123 in this structure can be defined as a region having a larger p than those in regions (low Al composition regions 126) adjacently above and below the high Al composition region 123, and the low Al composition region 126 can be defined as a region having a smaller p than those in regions (high Al composition regions 123) adjacently above and below the low Al composition region 126. This structure is effective in the case where three or more layers (four or more layers of the high Al composition region 123 corresponding to the low Al composition region 126) of the low Al composition region 126 are formed. In the case of the structure illustrated in FIG. 8, the lattice mismatch between the adjacent high Al composition region 123 and low Al composition region 126 can be reduced over the entire region of the buffer layer.

Although the thicknesses of the high Al composition region 123 and low Al composition region 126 are made constant in each of the composition distributions illustrated in FIGS. 7 and 8, the thickness of the high Al composition region 123 may be made smaller in the upper and lower ends and larger in the center portion as in the case of the second embodiment. Further, a composition distribution may be adopted in which the value of p is made constant (e.g., p=1) for all the high Al composition regions 123 and only the value of p in the low Al composition region 126 is set as illustrated in FIG. 8. Further, although the difference between the value of p in a given high Al composition region 123 and value of p in a low Al composition region 126 that is positioned immediately above the given high Al composition region 123 is made constant in FIG. 8, a composition distribution may be adopted in which the difference is made larger in the center portion and smaller in the upper and lower ends.

In the case where the channel layer is formed not of semi-insulating GaN but of semi-insulating AlGaN, the low-resistance region at the upper end in the buffer layer is not formed of GaN but made conform to the semi-insulating AlGaN composition, as in the first and second embodiments. Further, the channel layer may be formed of a more common material such as $Al_xM_yGa_{1-x-y}N$ as in the first and second embodiments.

Fourth Embodiment

Figure 9:
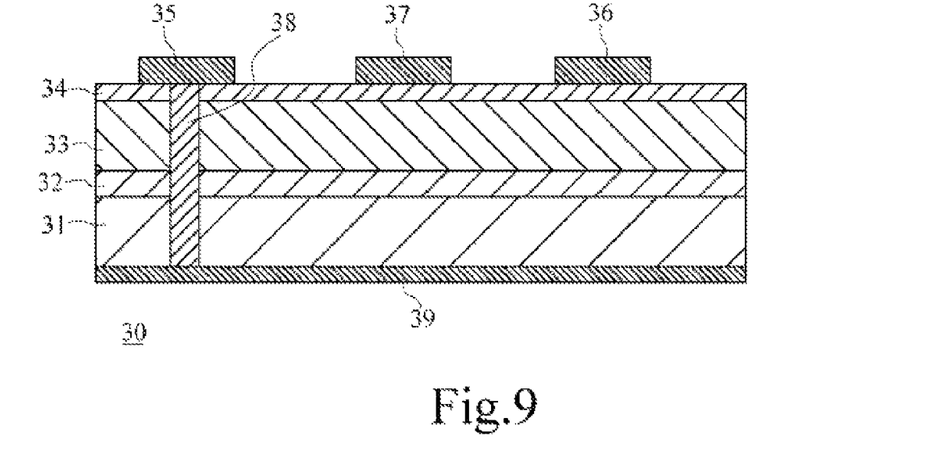
FIG. 9 is a cross-sectional view of the HEMT device according to a fourth embodiment of the present invention.

In the HEMT devices according to the first to third embodiments, the structure of the buffer layer is optimized to suppress a buffer leak to thereby increase off-resistance. However, in the actual HEMT device, etc., it is important not only to increase the off-resistance but also to reduce on-resistance so as to increase off/on resistance ratio. FIG. 9 is a cross-sectional view of an HEMT device according to a fourth embodiment in which the buffer layer according to the first, second, or third embodiment is used to suppress a buffer leak and further the on-resistance is reduced to increase the off/on resistance ratio.

In the HEMT device 30 according to the fourth embodiment, a buffer layer 32, a channel layer 33 (semi-insulating GaN), an electron supply layer 34 (n-AlGaN), a source electrode 35, a drain electrode 36, and a gate electrode 37 are formed on a substrate 31 (n-GaN wafer) like the structure illustrated in FIG. 1. As the buffer layer 32, one according to the first, second, or third embodiment may be used. In this structure, a penetrating electrode 38 that penetrates the channel layer 33, buffer layer 32, and substrate 31 is formed between the source electrode 35 which is one of electrodes through current flows and the substrate 31. The penetrating electrode 38 is connected to a rear surface electrode 39 formed on the rear surface of the substrate 31.

The configurations and effects of the penetrating electrode 38 and rear surface electrodes 39 are the same as those described in the seventh embodiment (FIG. 14) of Patent Document 2. That is, this configuration allows the rear surface electrode 39 formed widely on the rear surface to be used as a source electrode, thereby reducing the on-resistance. Further, this configuration eliminates the need to form a source electrode pad on the front (upper) surface of the HEMT device 30, thereby allowing efficient use of the entire chip. This structure is particularly effective since the substrate 31 has a conductive property.

In this structure, the actual distance between the rear surface electrode 39 (source) and drain electrode 36 is smaller than that in the structure of FIG. 1. Further, the substrate 31 has a conductive property, so that the insulating property between the rear surface electrode 39 and drain electrode 36 is mainly determined by the buffer layer 32. Thus, the use of the buffer layer according to the first, second, or third embodiment in which high insulating property is maintained by the high Al composition region and electrical conduction due to crystal defect is suppressed is particularly effective for the structure of the fourth embodiment.

As a result, the HEMT device 30 can obtain a high off/on resistance ratio. The similar structure may be used in the SBD. In this case, the penetrating electrode may be formed between the anode or cathode electrode and substrate 31.

As in the case of FIG. 13 of Patent Document 2, in the case where the substrate 31 has a high conductive property, the penetrating electrode 38 need not penetrate the substrate 31. Also in this case, the on-resistance can be reduced. Further, as long as the on-resistance can be reduced, the rear surface electrode 39 has any configuration and the rear surface electrode 39 need not be formed on the entire rear surface of the substrate 31.

It is apparent that the structure of the forth embodiment in which the penetrating electrode 38 is used may be applied not only to the HEMT device and SBD but to other electronic devices.

What is claimed is:

1. A semiconductor device having a configuration in which an active layer having a composition represented by a chemical formula:

in which $0 \leq x<1$, $0 \leq y<1$, $0 \leq x+y<1$, and wherein M contains at least one of In and B, is formed on a conductive gallium nitride (GaN) substrate via a buffer layer and operates with current flowing through the active layer in the direction parallel to the surface of the substrate, wherein the buffer layer has a composition represented by a chemical formula:

and includes:
a substrate connection region where p=q=0 which is formed on the side contacting the substrate in the thickness direction thereof;
an active layer connection region where p=x and q=y which is formed on the side contacting the active layer in the thickness direction; and
a high Al composition region with higher resistivity compared to the substrate, wherein $1 \geq p > x$ and $1 > q \geq 0$, which is formed between the substrate connection region and active layer connection region in the thickness direction.

2. The semiconductor device according to claim 1, wherein the buffer layer includes:
a substrate side gradient composition region which is formed between the high Al composition region and substrate connection region in the thickness direction and has a gradient composition that varies such that the composition of the substrate side gradient composition region becomes the same as that of the high Al composition region on the high Al composition region side and composition of the substrate side gradient composition region becomes the same as that of the substrate connection region on the substrate connection region side; and
a active layer side gradient composition region which is formed between the high Al composition region and active layer connection region in the thickness direction and has a gradient composition that varies such that the composition of the active layer side gradient composition region becomes the same as that of the high Al composition region on the high Al composition region side and composition of the active layer side gradient composition region becomes the same as that of the active layer connection region on the active layer connection region side.

3. The semiconductor device according to claim 1, wherein the buffer layer includes a configuration in which a plurality of the high Al composition regions are arranged with a plurality of low Al composition regions in each of which $p<p_1$ in the case where the value of p in the high AL composition region is set to $p_1$ ($p=p_1$) interposed between two adjacent high Al composition regions in the thickness direction.

4. The semiconductor device according to claim 3, wherein three or more layers of the high Al composition region are formed, and
the high Al composition region formed in the thickness direction center portion of the buffer layer has a larger thickness than those of the high Al composition regions formed in the thickness direction both ends of the buffer layer.

5. The semiconductor device according to claim 3, wherein four or more layers of the high Al composition region are formed, and
the low Al composition region formed in the thickness direction center portion of the buffer layer has a smaller thickness than those of the low Al composition regions formed in the thickness direction both ends of the buffer layer.

6. The semiconductor device according to claim 3, wherein three or more layers of the high Al composition region are formed, and
the high Al composition region formed in the thickness direction center portion of the buffer layer has a larger p value than those of the high Al composition regions formed in the thickness direction both ends of the buffer layer.

7. The semiconductor device according to claim 3, wherein four or more layers of the high Al composition region are formed, and
the low Al composition region formed in the thickness direction center portion of the buffer layer has a larger p value than those of the low Al composition regions formed in the thickness direction both ends of the buffer layer.

8. The semiconductor device according to claim 1, wherein one of electrodes connected to the active layer is connected to the substrate via a penetrating electrode penetrating the buffer layer.

9. The semiconductor device according to claim 8, wherein a rear surface electrode is formed on the surface of the substrate opposite to the surface on which the buffer layer is formed, and
the penetrating electrode penetrates the substrate to be connected to the rear surface electrode.

* * * * *